US006492078B1

(12) United States Patent
Ohnuma

(10) Patent No.: US 6,492,078 B1
(45) Date of Patent: Dec. 10, 2002

(54) CORRECTING METHOD OF EXPOSURE PATTERN, EXPOSURE METHOD, EXPOSURE SYSTEM, PHOTOMASK AND SEMICONDUCTOR DEVICE

(75) Inventor: Hidetoshi Ohnuma, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/504,854

(22) Filed: Feb. 16, 2000

(30) Foreign Application Priority Data

Feb. 16, 1999 (JP) .......................................... 11-037904

(51) Int. Cl.$^7$ ................................................. G03F 9/00
(52) U.S. Cl. ............................................. 430/30; 430/5
(58) Field of Search ........................................ 430/5, 30

(56) References Cited

U.S. PATENT DOCUMENTS

| 6,044,007 A | * | 3/2000 | Capodieci | .................... 430/30 |
| 6,071,658 A | * | 6/2000 | Wu et al. | ..................... 430/30 |
| 6,120,952 A | * | 9/2000 | Pierrat et al. | ................. 430/30 |
| 6,120,953 A | * | 9/2000 | Lin | ............................. 430/30 |
| 6,127,071 A | * | 10/2000 | Lu | .............................. 430/30 |
| 6,137,901 A | * | 10/2000 | Harazaki | ..................... 430/30 |
| 6,168,891 B1 | * | 1/2001 | Shibata | ....................... 430/30 |
| 6,183,920 B1 | * | 2/2001 | Tsujikawa et al. | ............ 430/30 |
| 6,214,494 B1 | * | 4/2001 | Bula et al. | .................... 430/30 |

* cited by examiner

*Primary Examiner*—Christopher G. Young
(74) *Attorney, Agent, or Firm*—Rader Fishman & Grauer PLLC; Ronald P. Kananen, Esq.

(57) ABSTRACT

The present invention provides a correcting method of exposure pattern, an exposure method, a exposure system, a photomask and a semiconductor device, which can simplify an operation required for correcting an optical proximity effect of a light shielding film pattern and data processing. A serif pattern (37) relative to a light shielding film pattern (35) constituting a layout-designed exposure pattern (1) is prepared, and the light shielding film pattern (35) and the serif pattern (37) is graphically computed so as to correct the light shielding film pattern (35). An optical proximity effect in exposure is corrected by using the light shielding film pattern (35), and thereby, it is possible to simplify operational processing required for making an optical proximity effect correction with respect to the light shielding film pattern (35), and to considerably shorten a processing time for making the optical proximity effect correction.

10 Claims, 8 Drawing Sheets

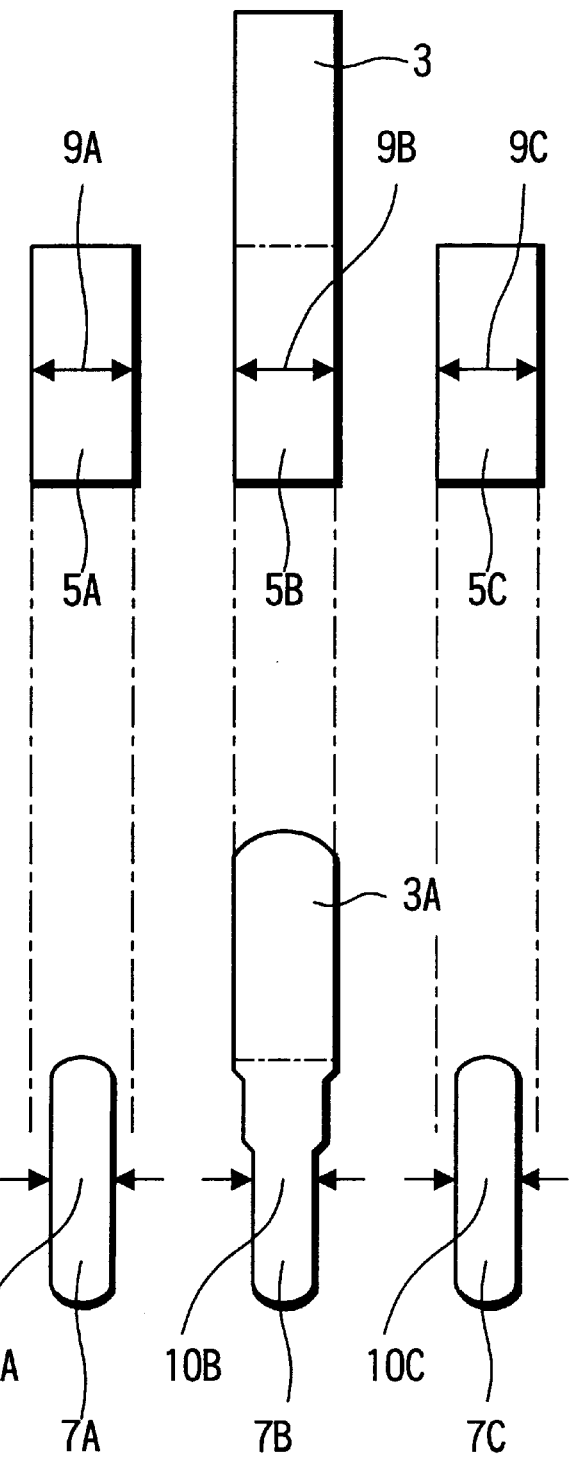

CORRECTING METHOD OF EXPOSURE PATTERN, EXPOSURE METHOD, EXPOSURE SYSTEM, PHOTOMASK AND SEMICONDUCTOR DEVICE

BACKGROUND OF THE INVENTION

1. Field of the Invention

The present invention relates to a correcting method of exposure pattern, an exposure method, an exposure system, a photomask and a semiconductor device.

2. Description of the Related Art

In the case of preparing a photomask having a light shielding film pattern, prior to a manufacturing process of a semiconductor device, computer-aided design (CAD) data relative to an exposure pattern having a previously designed light shielding film pattern is converted into data for lithography system. Subsequently, patterning is faithfully carried out by the lithography system on the basis of the above data for lithography system so as to generate an exposure pattern having the light shielding film pattern thus prepared. Then, the exposure pattern is transferred onto a glass substrate using a photographic technology so as to generate a photomask having the exposure pattern.

In the manufacturing process of a semiconductor device, the exposure pattern on the photomask is projected on a semiconductor wafer, on which a photosensitive thin film is previously formed, by using a pattern transfer technology such as a so-called photolithography. Then, the photosensitive thin film is exposed by light and is then developed. Thus, a resist pattern faithfully following a shape of the light shielding film is generated on the semiconductor wafer.

Reference document:

"Illustrated Ultra-LSI Optics (Zukai Cho-LSI Kogaku)" published by Tetsugaku Shuppan (K.K.)

In this photolithography process in the manufacturing process of a semiconductor device, a resist pattern having a pattern width near a wavelength of light used for exposure is formed on a semiconductor wafer, and an interference effect of light remarkably appears in the exposure. As a result, a defect by optical proximity effect becomes a problem. Specifically, the optical proximity effect is a factor in causing a dimensional error between a pattern prepared in making a design and the resist pattern that uses the prepared pattern and is generated on the semiconductor wafer in the aforesaid manner using the pattern.

The defect by optical proximity effect appears as an enlargement phenomenon of a width of resist pattern occurring between a plurality of resist line patterns which are formed by being repeatedly arranged, and as a line shrinkage phenomenon occurring in an end portion of an isolated resist pattern. For this reason, in a manufacturing process of the semiconductor device, there is the possibility of causing problems such as a deterioration of gate line width control and a reduction of margin in alignment.

In a semiconductor device manufactured by the manufacturing process having the problem as described above, a dispersion increases in a transistor characteristic, and finally, the yield is reduced. As a result, there is the possibility of remarkably giving an influence to a productivity of a semiconductor chip.

The aforesaid problem is a fatal factor in a manufacturing process of a repeated memory cell requiring a high integration. In order to solve the above problem, after generation of device manufactured by a manufacturing process based on a design by 0.35 $\mu$m rule, there is a need for exposing a pattern width in the vicinity of exposure wavelength of a light used in exposing on a semiconductor wafer. For this reason, a high, accurate optical proximity effect automatic correction (hereinafter, referred simply to as OPC) system based on a light intensity simulation has been developed.

After generation of manufacturing a semiconductor device on the basis of a design by 0.35 $\mu$m rule, the defect resulting from the optical proximity effect appears as the following phenomena. The phenomena includes a dispersion of a line width of a line pattern arranged and formed in not only repeated memory cell area but also one chip random circuit IC area generated by an ASIC (application specific IC) type semiconductor device such as gate array or the like, and a line shrinkage occurring in an end portion of an isolated resist pattern. Finally, the yield is reduced. As a result, there is a problem of remarkably giving an influence to a productivity of a semiconductor IC chip.

In the aforesaid random circuit IC, in order to correct the optical proximity effect in a random pattern formed into a one-chip scale, the OPC system based on light intensity simulation is applied. However, in this case, the following problems arise. Specifically, a huge calculating time for calculating the correction data is required, and there is an influence of increasing of the number of days required for TAT (turn-around time) from design to manufacturing processes of a semiconductor chip.

For example, a required time for making a correction for each cell unit of about several pm angle is about 10 seconds. However, about several hundreds of days are required in the case of correcting all of defects resulting from the optical proximity effect for each cell unit of the entire semiconductor chip.

In order to solve the problem of requiring a huge required time, the following method has been known as a proper method. Specifically, there is a rule base method of correcting the defect of only limited pattern of the entire IC chip on the basis of a previously set rule. However, at present, this method has no level of making a perfectly satisfied correction on defect.

Next, with reference to FIGS. 4A and B, FIGS. 5A and B and FIG. 8, the following examples will be described. More specifically, there are shown light intensity simulation results of an influence of an optical proximity effect resulting from a coarse and dense dependency of pattern array, and of correcting a pattern receiving the optical proximity effect by using a conventional method.

In FIG. 4A, a reference numeral 1 denotes an exposure pattern formed on a photomask, and the exposure pattern 1 is composed of an isolated light shielding film pattern portion 3, light shielding film pattern portions 5A, 5B and 5C which are densely arranged in parallel with each other.

FIG. 4B shows a resist pattern 7 that is formed on a surface of a semiconductor wafer by exposing the semiconductor wafer using a photomask including the pattern 1 described and shown in FIG. 4A. In the resist pattern 7, 3A is a resist pattern according to the light shielding film pattern portion 3, 7A is a resist pattern according to the light shielding film pattern portion 5A, 7B is a resist pattern according to the light shielding film pattern portion 5B, and 7C is a resist pattern according to the light shielding film pattern portion 5C.

As seen from the resist pattern portions 7A, 7B and 7C shown in FIG. 4B, individual pattern widths 10A, 10B and 10C of these resist pattern portions are formed narrower than individual widths 9A, 9B and 9C of the light shielding film patterns 5A, 5B and 5C. In other words, there is a problem that these pattern widths 10A, 10B and 10C are formed narrower than the pattern width of the resist pattern 3A resulting from an influence of the optical proximity effect.

Next, shrinkage of each pattern width shown in FIG. 4A and FIG. 4B resulting from the optical proximity effect is subjected to a light intensity simulation. Based on the simulation result, individual widths 9A, 9B and 9C of the light shielding film patterns 5A, 5B and 5C are corrected, and then, a semiconductor wafer is exposed using the corrected photomask so as to form a resist pattern. The light intensity simulation result of the resist pattern will be described below with reference to FIG. 5A and FIG. 5B.

In FIG. 5A, a reference numeral 11 denotes an exposure pattern of the corrected photomask, and the exposure pattern 11 is composed of an isolated light shielding film pattern portion 13, light shielding film pattern portions 15A, 15B and 15C which are densely arranged in parallel with each other.

In the exposure pattern 11 shown in FIG. 5A, based on the light intensity simulation result of the shrinkage resulting from the optical proximity effect of each pattern shown in FIG. 4A, a pattern width 13A of the isolated light shielding film pattern portion 13 is corrected, and then, the pattern width 13A of the isolated light shielding film pattern portion 13 is formed narrower than individual pattern widths 19A, 19B and 19C of the light shielding film pattern portions 15A, 15B and 15C.

FIG. 5B shows a resist pattern 17 that is formed on a surface of a semiconductor wafer by exposing the semiconductor wafer using a photomask including the pattern 11 described and shown in FIG. 5A. In the resist pattern 17, 16A is a resist pattern according to the light shielding film pattern portion 13, 17A is a resist pattern according to the light shielding film pattern portion 15A, 17B is a resist pattern according to the light shielding film pattern portion 15B, and 17C is a resist pattern according to the light shielding film pattern portion 15C.

As seen from the resist pattern portions 17A, 17B and 17C shown in FIG. 5B, resulting from an influence of the optical proximity effect, individual pattern widths 20A, 20B and 20C of these resist pattern portions are formed narrower than individual widths 19A, 19B and 19C of the light shielding film patterns 15A, 15B and 15C. However, the pattern width 13A of the light shielding film pattern portion 13 is corrected on the basis of the light intensity simulation result. Therefore, it is possible to form the pattern width 16B having the same width as the pattern width 20B. Thus, it is possible to solve the problem as described in FIG. 4B.

Next, a pattern 27 shown in FIG. 6A is an isolated light shielding film pattern formed on a photomask, a pattern 29A shown in FIG. 6B is a resist pattern whose end portion causes a shrinkage resulting from an influence of the optical proximity effect when exposing the isolated light shielding film pattern 27 formed on the photomask on a semiconductor wafer so as to form a resist pattern on a surface of the semiconductor wafer.

Pattern 29 shown by a dotted chain line in FIG. 6B is an assumed resist pattern that will be formed in the case where the resist pattern exposed on the semiconductor wafer and formed on the surface thereof causes no shrinkage.

Pattern 31 shown in FIG. 6C is a pattern that corrects the shrinkage to a direction extending a longitudinal pattern width 27A of the isolated light shielding film pattern portion 27 on the basis of the light intensity simulation result. Thus, when the pattern 31 is exposed onto the semiconductor wafer so as to form a resist pattern on the surface thereof, as shown in FIG. 6D, the resist pattern can be generated as a pattern 33 having the same length as the pattern 29 shown by the dotted chain line.

According to the conventional correcting methods as described above, in the case where there is a need for exposing a pattern width having a size near an exposure wavelength of light used in exposure on a semiconductor wafer, an edge of the pattern is divided. Then, a light shielding film pattern formed on the photomask is exposed on the semiconductor wafer for each divided edge of the pattern so as to generate a semiconductor transfer resist pattern. Subsequently, bias is applied to the resist pattern for each divided edge so that a pattern having a desired shape can be obtained, and thus, correction is made.

The following methods have been proposed as the method of applying bias. Specifically, there are a method of reading a pattern for each divided edge as a data, and computing the data so as to obtain correction data, and a method of obtaining the correction data by mutually connecting moved edges after being moved for edge unit.

However, according to the aforesaid conventional methods, the operation as described above is successively carried out with respect to all patterns per semiconductor wafer formed on the photomask, and then, correction data is generated. For this reason, a processing time for the operation is much spent, and a large amount of memory is required for storing a pattern data generated by the operation. As a result, there is a problem that the operation must be carried out while transferring the memory contents to other high capacity memory, and therefore, a much of time is required. Moreover, it is difficult to obtain a correction data by carrying out the operation in a TAT having a range allowable in practical use.

SUMMARY OF THE INVENTION

In order to solve the above problems, the present invention provides a correcting method of an exposure pattern comprising the following steps of: generating a serif pattern relative to a layout-designed exposure pattern; correcting the layout-designed exposure pattern by graphically computing the layout-designed exposure pattern and the serif pattern; and correcting an optical proximity effect in exposure by the layout-designed exposure pattern. Therefore, it is possible to rapidly perform operational processing for correcting the optical proximity effect.

Further, the present invention provides an exposure method using an exposure pattern, comprising the following steps of: generating a serif pattern relative to a layout-designed exposure pattern; correcting the layout-designed exposure pattern by graphically computing the layout-designed exposure pattern and the serif pattern; and using an exposure pattern correcting an optical proximity effect in exposure by the layout-designed exposure pattern. Therefore, it is possible to rapidly perform operational processing for correcting the optical proximity effect of the exposure pattern.

Further, the present invention provides an exposure system using an exposure pattern, which generates a serif pattern relative to a layout-designed exposure pattern, and corrects the layout-designed exposure pattern by graphically computing the layout-designed exposure pattern and the serif pattern, and further, uses an exposure pattern correcting an optical proximity effect in exposure by the layout-designed exposure pattern. Therefore, it is possible to rapidly perform operational processing for correcting the optical proximity effect of the exposure pattern of the exposure system.

Further, the present invention provides a photomask including an exposure pattern, which generates a serif pattern relative to a layout-designed exposure pattern, and corrects the layout-designed exposure pattern by graphically computing the layout-designed exposure pattern and the serif pattern, and further, corrects an optical proximity effect in exposure by the layout-designed exposure pattern. Therefore, it is possible to realize a photomask that is capable of rapidly performing operational processing for correcting the optical proximity effect of the exposure pattern.

Further, the present invention provides a semiconductor device manufactured in the following manner of: generating a serif pattern relative to a layout-designed exposure pattern; correcting the layout-designed exposure pattern by graphically computing the layout-designed exposure pattern and the serif pattern; and using an exposure pattern correcting an optical proximity effect in exposure by the layout-designed exposure pattern. Therefore, it is possible to provide a semiconductor device using a correction exposure pattern that is capable of rapidly performing operational processing for correcting the optical proximity effect of the exposure pattern.

BRIEF DESCRIPTION OF THE DRAWINGS

FIGS. 4A and 4B are views showing a light shielding film and a resist pattern generated by a conventional method;

DETAILED DESCRIPTION OF THE PREFERRED EMBODIMENTS

Figure 1:
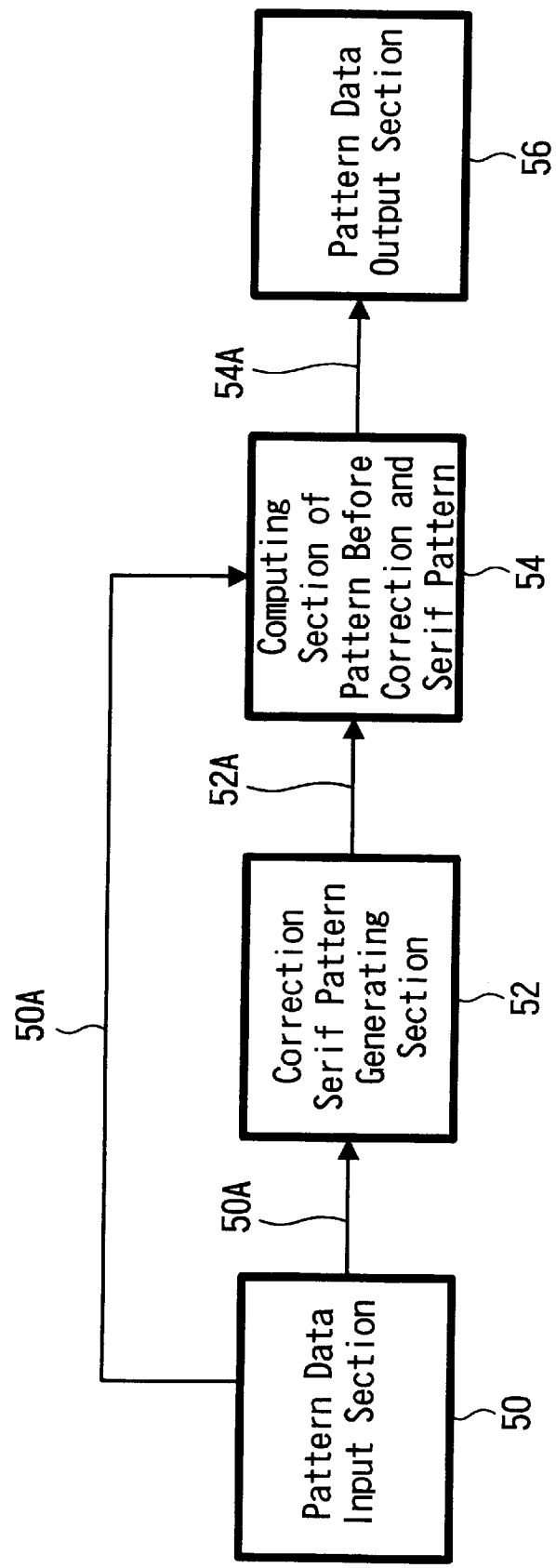
FIG. 1 is a block diagram showing principal parts of a lithography system according to the present invention.

A correcting method of exposure pattern, an exposure method, a exposure system, a photomask and a semiconductor device according to one embodiment of the present invention will be described below with reference to FIG. 1 to FIG. 2 and FIGS. 3A to 3I. In this case, like reference numerals are used to designate the same portions as shown in FIGS. 4A to 4B, 5A to 5B and 6A to 6D.

Figure 2:
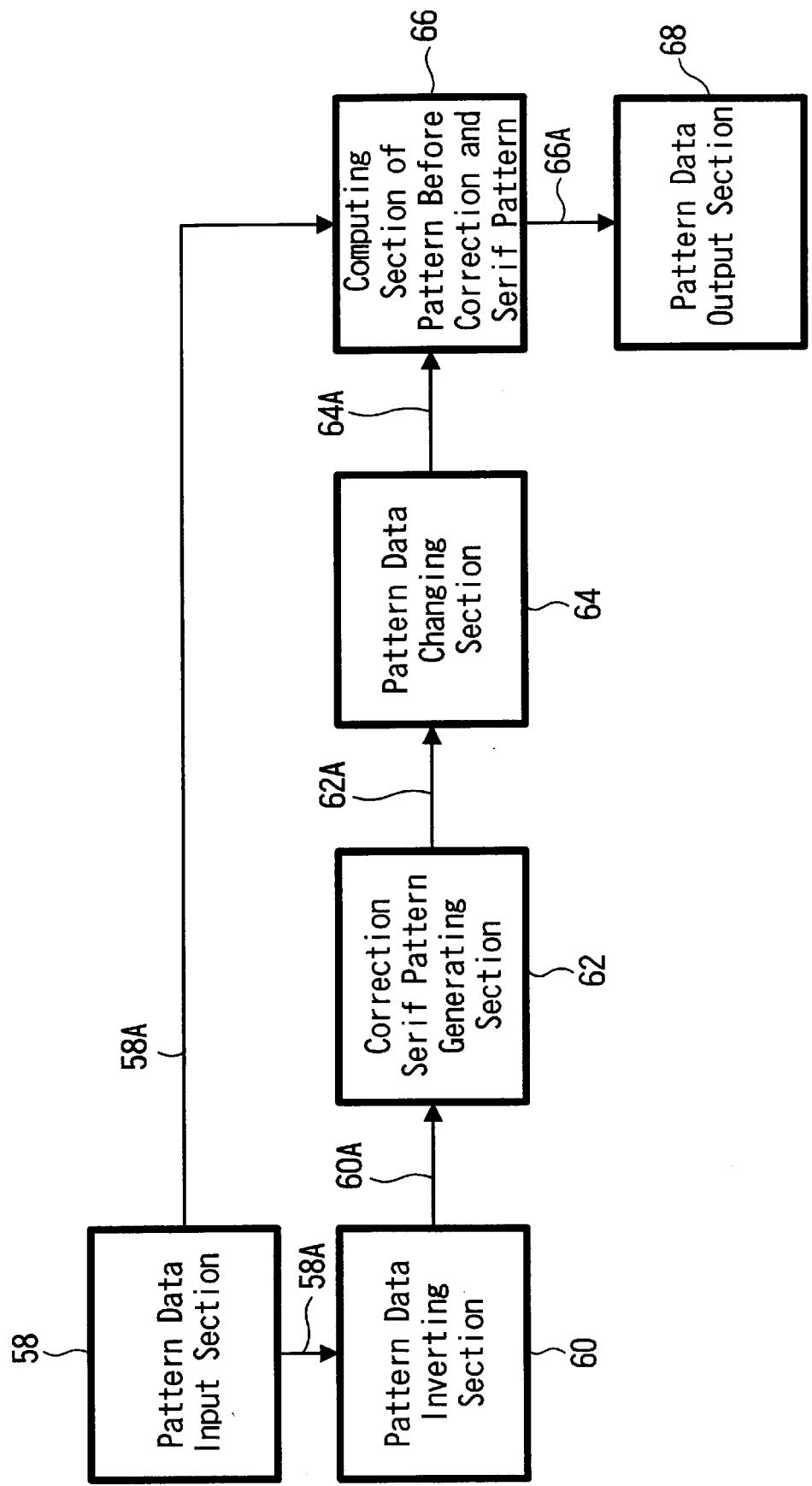
FIG. 2 is another block diagram showing principal parts of the lithography system of the present invention.

FIG. 1 and FIG. 2 are block diagrams showing principal parts of a pattern exposure (lithography) system which faithfully carries out patterning on a data relative to a light shielding film pattern, and projects it on a photomask so as to make an exposure pattern having the light shielding film pattern.

Figure 3A:
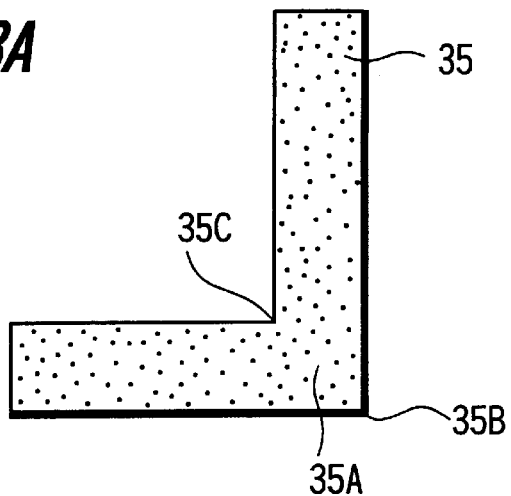
FIGS. 3A, 3B and 3C are views showing a light shielding film pattern according to the present invention.
Figure 3B:
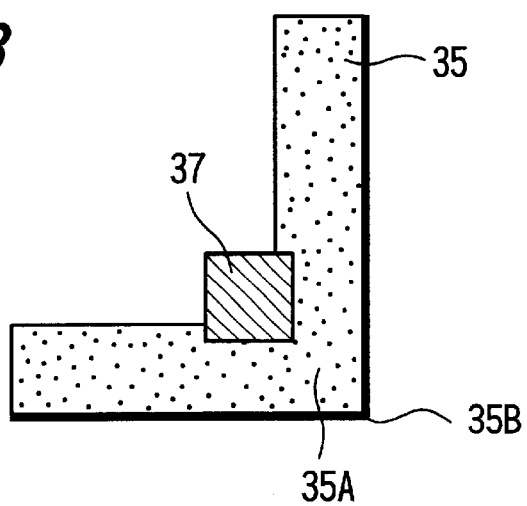
Figure 3C:
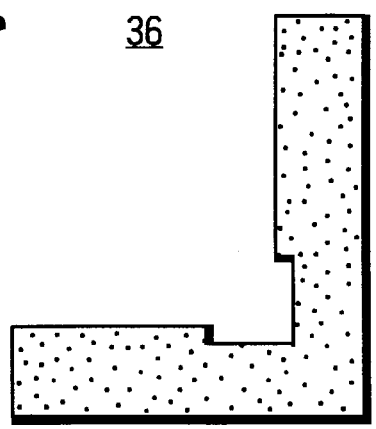

FIGS. 3A, 3B and 3C are views to explain a procedure for obtaining an exposure pattern 36 correcting a layout-designed exposure pattern 35 by graphically computing the layout-designed exposure pattern 35 and a serif pattern 37.

Figure 3D:
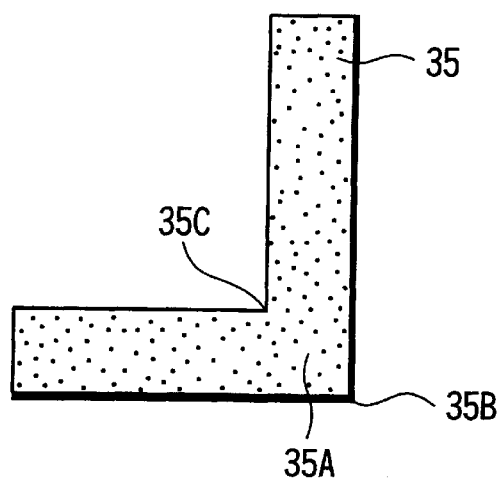
FIGS. 3D, 3E and 3F are views showing another light shielding film pattern according to the present invention.
Figure 3E:
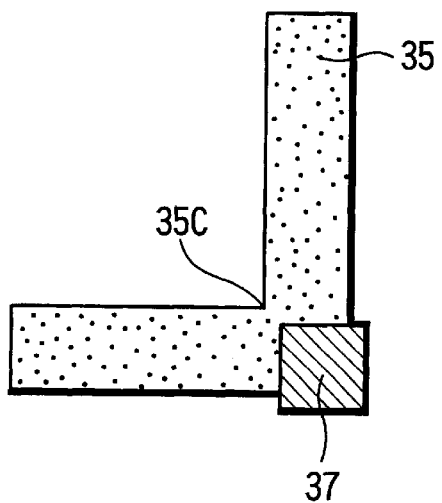
Figure 3F:
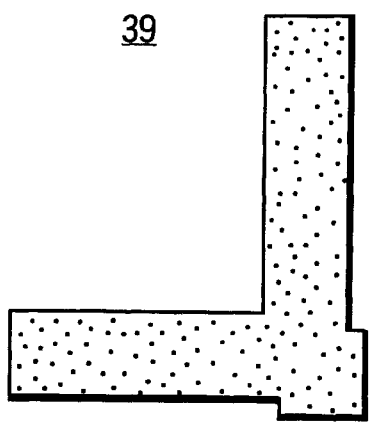

FIGS. 3D, 3E and 3F are views to explain a procedure for obtaining another exposure pattern 39 correcting a layout designed light shielding exposure 35 by graphically computing the layout-designed exposure pattern 35 and a serif pattern 37.

Figure 3G:
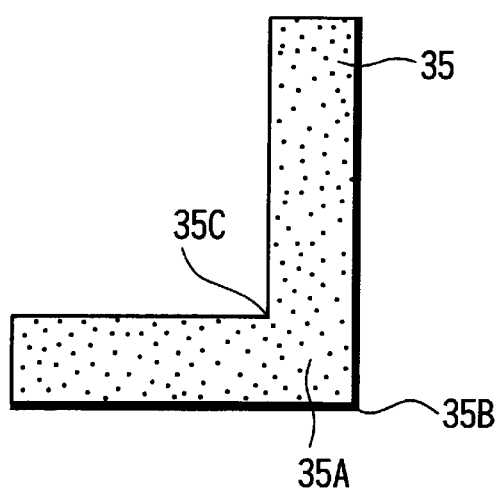
FIGS. 3G, 3H and 3I are views showing still another light shielding film pattern according to the present invention.
Figure 3H:
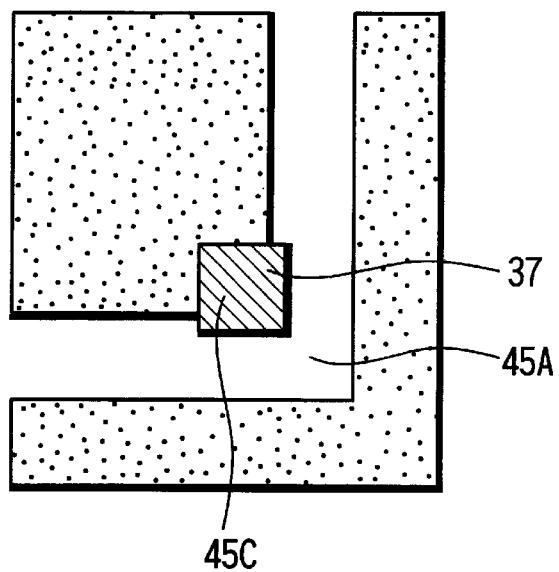
Figure 3I:
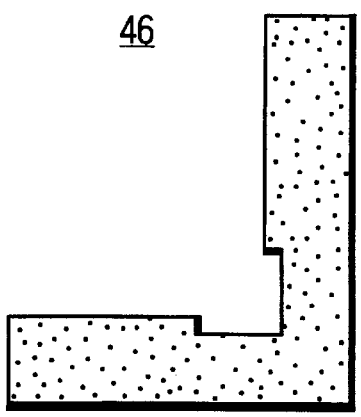
Figure 5A:
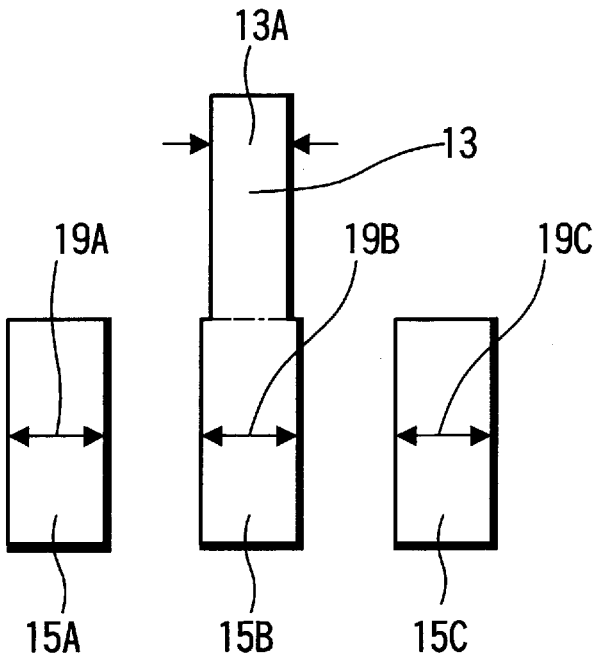
FIGS. 5A and 5B are views showing another light shielding film and resist pattern generated by the conventional method.
Figure 5B:
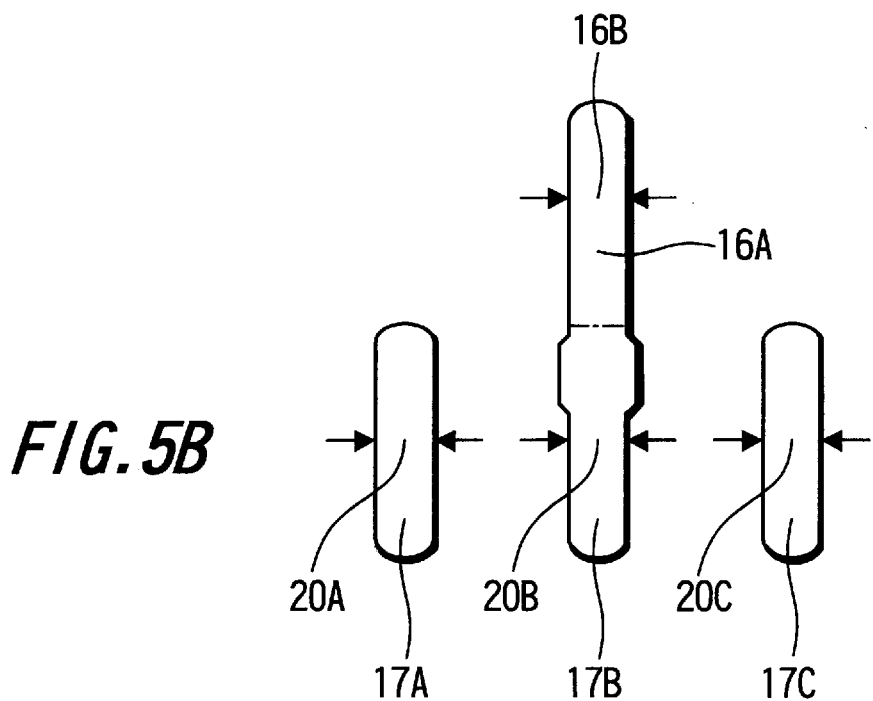
Figure 6A:
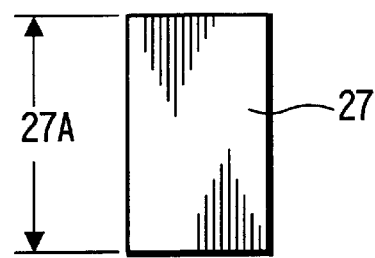
FIGS. 6A, 6B, 6C and 6D are views showing another light shielding film and resist pattern generated by the conventional method.
Figure 6B:
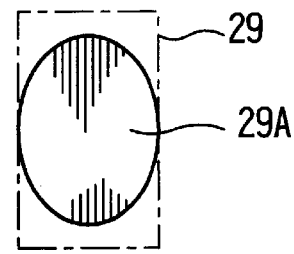
Figure 6C:
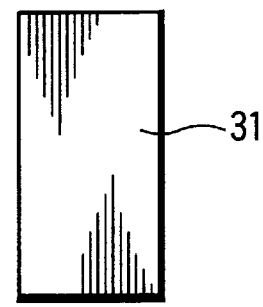
Figure 6D:
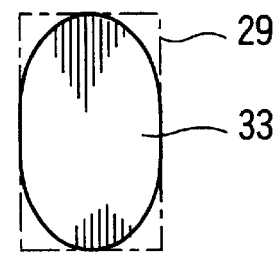

FIGS. 3G, 3H and 3I are views to explain a procedure for obtaining an exposure pattern 46 correcting a layout-designed exposure pattern 35 by graphically computing the layout-designed exposure pattern 35 and a serif pattern 45C.

First, when a semiconductor wafer is exposed using an exposure pattern so as to form a resist pattern, a roundness is formed by optical proximity effect at a portion on the resist pattern side corresponding to an outer side portion 35B of a corner portion 35A of the light shielding film pattern 35 on the exposure pattern side. An operation in the case of correcting the light shielding film pattern 35 so as to suppress roundness will be described below with reference to FIG. 1, FIGS. 3A, 3B and 3C.

A lithography system shown in FIG. 1 comprises: a pattern data input section 50; a correction serif pattern generating section 52, a computing (operational) section 54 of pattern before correction and serif pattern; and a pattern data output section 56. An output side of the input section 50 is connected to an input side of the correction serif pattern generating section 52, and an output side of the pattern generating section 52 is connected to an input side of the computing section 54 of pattern before correction and serif pattern. An output side of the computing section 54 is connected to an input side of the pattern data output section 56, and the other output side of the input section 50 is connected to the other input side of the computing section 54.

FIGS. 3A, 3B and 3C, a reference numeral 35 denotes a light shielding film pattern showing one example of many light shielding film patterns included in a layout-designed exposure pattern, and 37 denotes a serif pattern. The light shielding film pattern 35 has a shape (profile) of the light shielding film pattern before correcting the layout-designed exposure pattern by graphically computing the light shielding film pattern 35 and the serif pattern 37. Further, the light shielding film pattern 35 is generally formed into an invert L-shaped pattern.

In order to suppress a roundness formed by optical proximity effect at a portion on the resist pattern side corresponding to an outer side portion 35B of a corner portion 35A of the light shielding film pattern 35 on the exposure pattern side, as shown in FIG. 3B, in a state that the inner side portion 35C of the corner portion 35A is overlaid with the serif pattern 37, each pattern/position data of the light shielding film pattern 35 and the serif pattern 37 is computed. Subsequently, a portion overlaying the pattern/position data of the light shielding film pattern 35 with the pattern/position data of the serif pattern 37 is computed, and then, by carrying out an operation (computation) for deleting the above overlaid portion from the pattern/position data of the light shielding film pattern 35, it is possible to generate a light shielding film pattern 36 which corrects optical proximity effect and has a shape as shown in FIG. 3C.

In the following description, when the pattern/position data of the light shielding film pattern 35 is expressed as A, and the pattern/position data of the serif pattern 37 is expressed as B, a graphic operation for obtaining a pattern/position data correcting the optical proximity effect is expressed as A SUB B.

Next, an operation of generating a pattern 36 will be described below with reference to FIG. 1.

A pattern/position data 50A of the light shielding film pattern 35 before correction is inputted to the correction serif pattern generating section 52 from the output side of the pattern data input section 50. Then, the pattern generating section 52 generates a serif pattern/position data 52A of the serif pattern 37 in a state that the serif pattern 37 is aligned with a position of the inner side portion 35C of the corner portion 35A of the light shielding film pattern 35 before correction, and inputs the data 52A thus generated to the computing section 54.

Subsequently, the pattern/position data 50A of the light shielding film pattern 35 before correction is inputted to the other input side of the computing section 54. The computing section 54 graphically computes A SUB B between the pattern/position data A expressed by the data 52A and the pattern/position data B expressed by the data 50A, and then, generates a light shielding film pattern 36 correcting optical proximity effect as shown in FIG. 3C as a pattern/position data 54.

Subsequently, the computing section 54 supplies the pattern/position data 54A to the pattern data output section 56. The pattern data output section 56 generates an exposure pattern data having the light shielding film pattern 36 as shown in FIG. 3C on the basis of the pattern/position data 54A, and then, converts the exposure pattern data into an electron beam data. The exposure pattern having a shape as shown in FIG. 3C is generated on a photomask by the electron beam.

Next, when a semiconductor wafer is exposed using an exposure pattern so as to form a resist pattern, a roundness is formed by optical proximity effect at a portion on the resist pattern side corresponding to an inner side portion 35C of a corner portion 35A of the light shielding film pattern 35 on the exposure pattern side. The following is a description on an operation in the case of suppressing a roundness will be described below with reference to FIG. 1, FIGS. 3D, 3E and 3F. In FIG. 4, like reference numerals are used to designate the same portions as FIGS. 3A, 3B and 3C, and the details are omitted.

In FIGS. 3D, E and F, a reference numeral 35 denotes a light shielding film pattern before correction showing one example of a plurality of light shielding film patterns included in a layout-designed exposure pattern, and 37 denotes a serif pattern.

In the example shown in FIGS. 3D, 3E and 3F, in order to suppress a roundness formed by optical proximity effect at a portion on the resist pattern side corresponding to an inner side portion 35C of a corner portion 35A of the light shielding film pattern 35 on the exposure pattern side, an exposure pattern including a light shielding film pattern 39 having a shape as shown in FIG. 3F is generated so as to correct an optical proximity effect affected to the resist pattern side is generated.

Next, an operation of generating the light shielding film pattern 39 having a shape as shown in FIG. 3F will be described below with reference to FIG. 1.

The pattern/position data 50A of the light shielding film pattern 35 before correction is inputted from the output side of the pattern data input section 50 to the correction serif pattern generating section 52. Then, the pattern/position data 52A of the serif pattern 37 is generated in a position of the outer side portion 35B of the corner portion 35A of the light shielding film pattern 35 in the pattern/position data 50A, and the data 52A thus generated is inputted to the computing section 54.

Subsequently, the pattern/position data 50A of the light shielding film pattern 35 before correction is inputted to the other input side of the computing section 54. Next, the computing section 54 graphically computes a logic OR of the serif pattern/position data 52A and the pattern/position data 50A of the light shielding film pattern 35 before correction so as to correct the pattern/position data 50A of the light shielding film pattern 35 before correction. Further, the computing section 54 generates the pattern/position data 54A of the light shielding film pattern 39 having a shape shown in FIG. 3F correcting an optical proximity effect in exposure.

The data 54A thus generated is supplied to the pattern data output section 56, and then, is converted into an electron beam data, and thus, the light shielding film pattern 39 having a shape shown in FIG. 3F is transferred onto the photomask by the electron beam.

Therefore, as described in the example shown in FIG. 1, FIGS. 3A, 3B and 3C, and FIGS. 3D, 3E and 3F, it is possible to rapidly correct a defect resulting from the optical proximity effect, that is, a roundness formed at the resist pattern portions corresponding to the inner and outer side portions 35C and 35B of the corner portion 35A of the light shielding film pattern 35.

Next, referring to FIG. 2 and FIGS. 3G, 3H and 3I, the following is a description on another example of the case of suppressing a roundness formed by the optical proximity effect at the resist pattern portions corresponding to the outer side portions 35B of the corner portion 35A of the light shielding film pattern 35.

A lithography system shown in FIG. 2 comprises: a pattern data input section 58; a pattern data inverting section 60; a correction serif pattern generating section 62; a pattern data changing section 64; a computing section 66 of pattern before correction and a serif pattern; and a pattern data output section 68.

An output side of the input section 58 is connected to each input side of the pattern data inverting section 60 and the computing section 66 of pattern before correction and a serif pattern, and an output side of the pattern data inverting section 60 is connected to an input side of the correction serif pattern generating section 62. An output side of the pattern data inverting section 60 is connected to an input side of the pattern data changing section 64, and an output side of the pattern data changing section 64 is connected to the other input side of the computing section 66 of pattern before correction and a serif pattern, and further, an output side of the computing section 66 is connected to an input side of the pattern data output section 68.

Next, the following is a description on an operation of the lithography system.

A pattern/position data 58A of the light shielding film pattern 35 before correction shown in FIG. 3G is supplied to the pattern data inverting section 60 so as to be inverted, and then, a pattern/position data of a light shielding film pattern having an inverted pattern 41 as shown in FIG. 3H is obtained as a data output 60A from the output side of the pattern data inverting section 60.

The data output 60A is supplied to the correction serif pattern generating section 62. Then, the correction serif pattern generating section 62 generates pattern/position data 62A of the serif pattern 37 obtained by overlaying the light shielding film pattern 41 with an inner side portion 45C of a corner portion 45A of the inverted light shielding film pattern 41 as shown in FIG. 3H. The data 62A thus generated is supplied to the pattern data changing section 64, and then, is changed so as to generate a changing serif pattern/position data 64A.

The changing serif pattern/position data 64A is supplied to the computing section 66 of the pattern before correction and the serif pattern. Subsequently, the computing section 66 graphically computes a logic OR of an image area expressed by the pattern/position data 58A of the light shielding film pattern 35 before correction and an image area expressed by the changing serif pattern/position data 64A, and then, generates a pattern/position data 66A of a light shielding film pattern 46 shown in FIG. 3I and correcting an optical proximity effect in exposure.

The pattern/position data 66A is supplied to the pattern data output section 68, and is converted into an electron beam data, and thereafter, is transferred onto the photomask, and thus, as shown in FIG. 3I, a light shielding film pattern having the same shape as FIG. 3C is generated on the photomask.

Accordingly, in the example described in FIG. 1 and FIG. 3A to FIG. 3C and the example described in FIG. 2 and FIG. 3G to FIG. 3I, there is no need of carrying out the operation of A SUB B as shown in FIG. 1 and FIG. 3A to FIG. 3C in operational processing for generating the exposure pattern data 66A having the light shielding film pattern 46 correcting the optical proximity effect in exposure, and it is possible to generate these pattern/position data 54A and 66A by a logic OR operation.

By making a combination of the example described in FIG. 1 and FIG. 3D to FIG. 3F and the example described in FIG. 2 and FIG. 3G to FIG. 3I, in order to suppress a roundness formed by optical proximity effect at a portion on the resist pattern side corresponding to the inner and outer side portions 35C and 35B of the corner portion 35A of the light shielding film pattern 35 on the exposure pattern side, the light shielding film data corresponding to pattern/position data correcting the optical proximity effect is generated. Then, the data thus generated is converted into an electron beam data, and is transferred onto the photomask. In the case of generating the light shielding film pattern, in accordance with the logic OR assumed data or logic inverting assumed data, an on-off state of the electron beam is directly controlled, and thereby, without actually carrying out a logic operation, it is possible to transfer the light shielding film pattern data correcting an optical proximity effect onto the photomask, and to generate the light shielding film patterns 39 and 46.

Therefore, according to this control method, no logic operation is carried out, and thereby, it is possible to simplify a construction of the lithography system that transfers these patterns on the photomask and draws them, and to rapidly correct a defect, that is, a roundness formed resulting from the optical proximity effect.

Each operation of the computing sections 54 and 64 of the pattern before correction and the serif pattern is collectively carried out after obtaining these serif pattern/position data 52A and 64A with respect to all of the light shielding film patterns requiring a correction of the optical proximity effect in the entire light shielding film patterns.

In the case of correcting the optical proximity effect, the light shielding film pattern 35 is not limited to the inverted L-shaped light shielding film pattern, and the correction is applicable to all of the light shielding film patterns having a shape requiring a correction of the optical proximity effect.

According to the present invention, in a manufacturing process of a semiconductor device, in the case of generating an exposure pattern on the photomask, it is possible to simplify an operation required for carrying out an optical proximity effect correction with respect to the exposure pattern and data processing required for the operation. Further, it is possible to considerably shorten a processing time for making the optical proximity effect correction, and in particular, to improve a productivity of LSI device having a high integration.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A correcting method of an exposure pattern comprising:
    forming a light shielding pattern, said light shielding pattern including a layout-designed exposure pattern;
    forming a serif pattern relative to said layout-designed exposure pattern;
    performing a computation to correct an optical proximity effect in exposure by said layout-designed exposure pattern; and
    forming a corrected layout-designed exposure pattern by using said computation and by removing said serif pattern.

2. A correcting method of claim 1, wherein said layout-designed exposure pattern has a corner portion, said corner portion having an outer side portion and an inner side portion, said step of using said computation comprising:
    overlaying a portion of said inner side portion with a portion of said serif pattern;
    removing said portion of said inner side portion from said layout-designed exposure pattern; and
    forming said corrected layout-designed exposure pattern from said step of removing.

3. A correcting method of claim 1, wherein said layout-designed exposure pattern has a corner portion, said corner portion having an outer side portion and an inner side portion, said step of using said computation comprising:
    overlaying a portion of said outer side portion with a portion of said serif pattern;
    logically OR'ing said layout-designed exposure pattern with said serif pattern; and
    forming said corrected layout-designed exposure pattern from said step of logically OR'ing.

4. A correcting method of claim 1, wherein said step of using said computation comprising:
    inverting said light shielding pattern to form an inverted light shielding pattern.

5. A correcting method of claim 4, wherein said inverted light shielding pattern has an inverted layout-designed exposure pattern, said inverted layout-designed exposure pattern having a corner portion, said corner portion having an outer side portion and an inner side portion, said step of using said computation further comprising:
    overlaying a portion of said inner side portion with a portion of said serif pattern;
    logically OR'ing said inverted light shielding pattern with said serif pattern; and
    forming said corrected layout-designed exposure pattern from said step of logically OR'ing.

6. An exposure method using an exposure pattern, comprising:
    forming a light shielding pattern, said light shielding pattern including a layout-designed exposure pattern;
    forming a serif pattern relative to said layout-designed exposure pattern;
    performing a computation to correct an optical proximity effect in exposure by said layout-designed exposure pattern;

forming a corrected layout-designed exposure pattern by using said computation and by removing said serif pattern; and transferring said corrected layout-designed exposure pattern onto a photomask.

7. An exposure method of claim 6, wherein said layout-designed exposure pattern has a corner portion, said corner portion having an outer side portion and an inner side portion, said step of using said computation comprising:

overlaying a portion of said inner side portion with a portion of said serif pattern;

removing said portion of said inner side portion from said layout-designed exposure pattern; and forming said corrected layout-designed exposure pattern from said step of removing.

8. An exposure method of claim 6, wherein said layout-designed exposure pattern has a corner portion, said corner portion having an outer side portion and an inner side portion, said step of using said computation comprising:

overlaying a portion of said outer side portion with a portion of said serif pattern;

logically OR'ing said layout-designed exposure pattern with said serif pattern; and forming said corrected layout-designed exposure pattern from said step of logically OR'ing.

9. An exposure method of claim 6, wherein said step of using said computation comprising:

inverting said light shielding pattern to form an inverted light shielding pattern.

10. An exposure method of claim 9, wherein said inverted light shielding pattern has an inverted layout-designed exposure pattern, said inverted layout-designed exposure pattern having a corner portion, said corner portion having an outer side portion and an inner side portion, said step of using said computation further comprising:

overlaying a portion of said inner side portion with a portion of said serif pattern;

logically OR'ing said inverted light shielding pattern with said serif pattern; and forming said corrected layout-designed exposure pattern from said step of logically OR'ing.

* * * * *